(12) United States Patent
Harris et al.

(10) Patent No.: US 7,376,871 B2
(45) Date of Patent: May 20, 2008

(54) CAM TEST STRUCTURES AND METHODS THEREFOR

(75) Inventors: George Ernest Harris, Garland, TX (US); Bryan Sheffield, Rowlett, TX (US); Dwayne Ward, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 458 days.

(21) Appl. No.: 10/635,348

(22) Filed: Aug. 6, 2003

(65) Prior Publication Data

US 2005/0120283 A1    Jun. 2, 2005

(51) Int. Cl.
*G01R 31/28* (2006.01)
(52) U.S. Cl. ................. 714/718; 365/200; 365/189.05
(58) Field of Classification Search ................ None
See application file for complete search history.

(56) References Cited

U.S. PATENT DOCUMENTS

| | | | | |
|---|---|---|---|---|
| 4,680,760 A | * | 7/1987 | Giles et al. ................. 714/718 |
| 5,289,403 A | * | 2/1994 | Yetter ........................ 365/49 |
| 5,491,703 A | * | 2/1996 | Barnaby et al. ............ 714/766 |
| 6,539,466 B1 | * | 3/2003 | Riedlinger ................... 711/207 |
| 6,550,034 B1 | * | 4/2003 | Riedlinger et al. ......... 714/733 |
| 6,564,344 B1 | * | 5/2003 | Bui et al. ................... 714/718 |
| 6,691,252 B2 | * | 2/2004 | Hughes et al. ............. 714/30 |
| 6,999,331 B2 | * | 2/2006 | Huang ........................ 365/49 |

* cited by examiner

*Primary Examiner*—Jacques H Louis-Jacques
*Assistant Examiner*—Steven D Radosevich
(74) *Attorney, Agent, or Firm*—Alan K. Stewart; W. James Brady; Frederick J. Telecky, Jr.

(57) ABSTRACT

Configurations and methods that enable the testing of CAM-specific circuitry, even if the memory is defective, are implemented by utilizing various test modes. Accordingly, the CAM can be debugged to isolate memory failures from priority encoder failures, which significantly reduces the need for design changes. The present invention provides the ability to test the CAM functions very efficiently, thereby reducing the test time.

15 Claims, 5 Drawing Sheets

CAM TEST STRUCTURES AND METHODS THEREFOR

FIELD OF THE INVENTION

The present invention generally relates to the field of electronic memories such as content-addressable memories (CAMs), and more particularly relates to testing CAMs.

BACKGROUND OF THE INVENTION

A Content Addressable Memory (CAM) is an application specific memory that allows its entire contents to be searched within a single clock cycle. Accordingly, a CAM is a storage array designed to quickly find the location of a particular stored value. By comparing the input against the data memory, a CAM determines if an input value matches the values stored in the array. If the comparison is done simultaneously, the CAM is operating at maximum efficiency. A match, when it exists, is found in one clock cycle.

A CAM stores words in an array, similar to a RAM. The write mode is comparable, but the CAM mode is very different. In a RAM, the word in a location is read by the address. In contrast, in a CAM, the data on the input is looking for a match. When a match is found, the output is the address in the array.

The number of address lines limits a RAMs data size. For example, a 10-bit bus addresses 1024 locations of 8-bit data. A CAM does not have this limitation because it does not use an address bus to read a location. To find a match of an 8-bit value in 1024 locations, an 8-bit bus on the input is required. When the data is found in the CAM, a match signal goes active. The output is the matching data address. Because a CAM does not need address lines to find data (CAM mode), the memory size can be easily extended. Accordingly, CAMs have become popular and are widely used in the arena of networking, Ethernet, ATM switches and diverse protocol applications.

However, in a CAM, there exists a need to be able to test the memory to verify that the memory is defect-free. The CAM search functions also need to be tested to verify that the CAM search is not defective. Because the CAM functions can only be verified if the memory is defect-free, often, in new CAM designs, a memory failure obscures defects in the CAM-specific circuitry. Therefore, there is a need to be able to test the CAM-specific circuitry, even if the memory is defective. However, there is no existing conventional method or structure, which tests the CAM-circuitry, notwithstanding that the memory is defective.

Therefore, a need exists to overcome the problems with the prior art as discussed above.

SUMMARY OF THE INVENTION

According to one aspect of the present invention, an electronic test structure for testing a CAM having a memory array containing memory cells is disclosed. The test structure contains a dummy match row unit coupled to the memory array and configured to match layout parasitics of the match lines of the memory cells, and a dummy match column having dummy match cells coupled to the memory array through the match lines. The dummy match column is configured so as to match bitline loading of the memory cells during a search. Further, a dummy timing circuit is coupled to the dummy match column and to the dummy match row. The dummy timing circuit is configured to always generate a miss on a dummy match line during the search, and a dummy match control circuit is coupled to the dummy timing circuit.

According to another aspect of the present invention, a method for testing a CAM includes setting mask inputs to high logic level for causing the data input to match all of the memory array contents so that the memory array generates all hits. It also includes generating (with each cell of a dummy match column) a logic high level on the match lines during a test mode. The method further includes passing the generated logic high levels onto a priority encoder through the memory array, so that the match lines from the memory array to the priority encoder transit to a high logic level and the priority encoder receives a miss on each memory word.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein:

FIG. 7A is a block diagram illustrating a dummy match row, while

FIG. 8A is a block diagram showing a dummy match column, while

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of the present invention.

DETAILED DESCRIPTION

The present invention, according to an embodiment, overcomes problems with the prior art by utilizing various test modes. The CAM can be debugged to isolate memory failures from priority encoder failures, which significantly reduces the need for design changes. Accordingly, the present invention provides the ability to test the CAM functions very efficiently, thereby reducing the test time.

Implementation Embodiments

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover, these embodiments are only examples of the many advantageous uses of the innovative teachings herein. In general, statements made in the specification of the present application do not necessarily limit any of the various claimed inventions. Moreover, some statements may apply to some inventive features, but not to others. In general, unless otherwise indicated, singular elements may be in the plural and vice versa with no loss of generality.

The scope of the present invention in its many embodiments is defined in the appended claims. Nonetheless, the invention and its many features may be more fully appreciated in the context of exemplary implementations disclosed and described herein which combine one or more embodiments of the invention with other concepts, architectures, circuits, and structures to achieve better results than previously achievable.

The present invention is particularly applicable to a CAM device, such as a single-port CAM memory, and it is in this context that the present invention will be described. Although the disclosed embodiments refer to single-port memories, they can also be applied to multiple-port memories.

Referring generally to CAMs, a typical CAM is similar in many ways to a Static Random Access Memory (SRAM), with the addition of a search function. During a search, data is provided to the memory through inputs, which is then compared with the data in each address of the entire memory array (or a sub-set) which will result in a "Match" ("Hit") for those words (individual memory entries) whose stored data is bit-wise equal to the incoming data and a "Mismatch" ("Miss") for those words whose stored data differs by at least one bit from the incoming data. The results are placed onto the match lines. One match line exists for each word.

If there is more than one matching entry, a priority encoder can be provided to sort out which matching memory location has the top priority and to make the address of the matching memory location available to a user.

Figure 1:
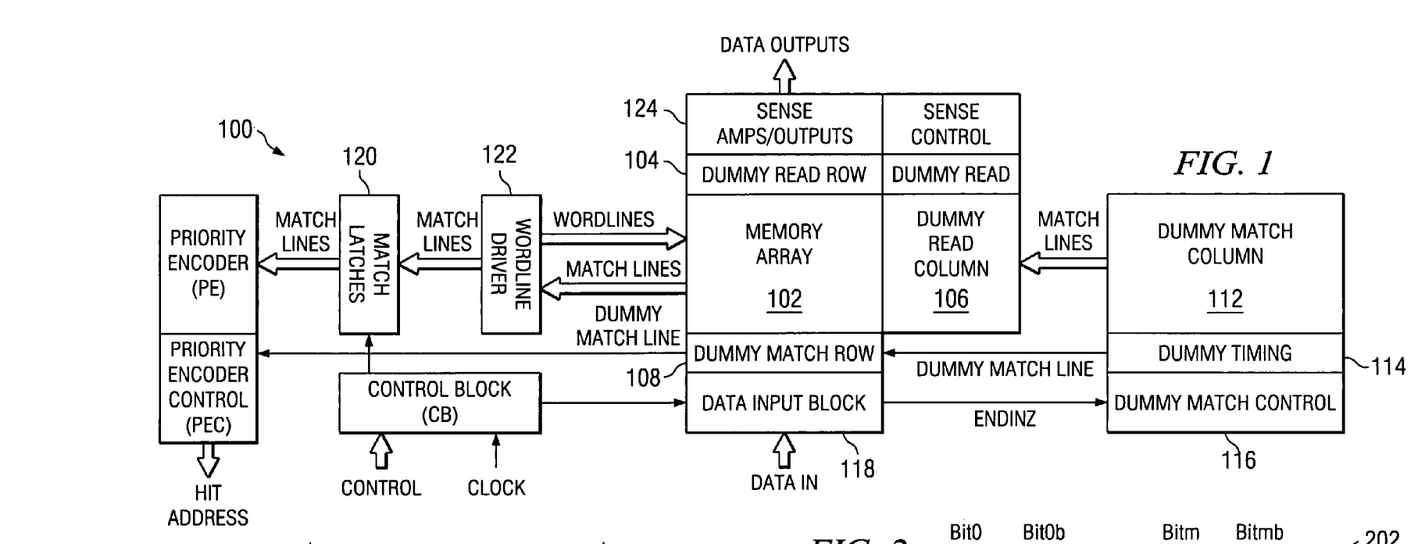
FIG. 1 is a block diagram illustrating a CAM device, according to the present invention.

Referring now to the drawings, FIG. 1 is a block diagram illustrating a CAM device 100 according to one embodiment of the present invention. Some features of the figures are believed to be relatively self-evident, but the features which may not immediately be apparent are worthy of description.

The CAM device 100 includes interconnected components such as a memory array 102 and a dummy read row 104. The dummy read row 104 is coupled to sense amplifiers 124 for outputting data via DATA OUTPUTS.

Further, a dummy read column 106 is coupled to the memory array 102. The dummy read column 106 is coupled to a dummy match column 112 through the match lines. The dummy match column 112 is coupled to a dummy timing circuit 114, which is coupled to a dummy match control circuit 116.

The dummy timing circuit 114 is further coupled to a dummy matching row 108 via a dummy match line, and to a priority encoder PE via a priority encoder control unit PEC. The priority encoder PE is coupled to the memory array 102 through match latches 120, a word line driver 122, and the match lines. Further, word lines couple the word line driver 122 and the memory array 102. The dummy match row 108 is also coupled to the memory array 102.

In addition, the dummy match control circuit 116 is coupled to a data input block 118 for receiving "DATA IN", which is coupled to a control block CB. The control block CB has CONTROL and CLOCK inputs, and is further coupled to the match latches 120.

Figure 2:
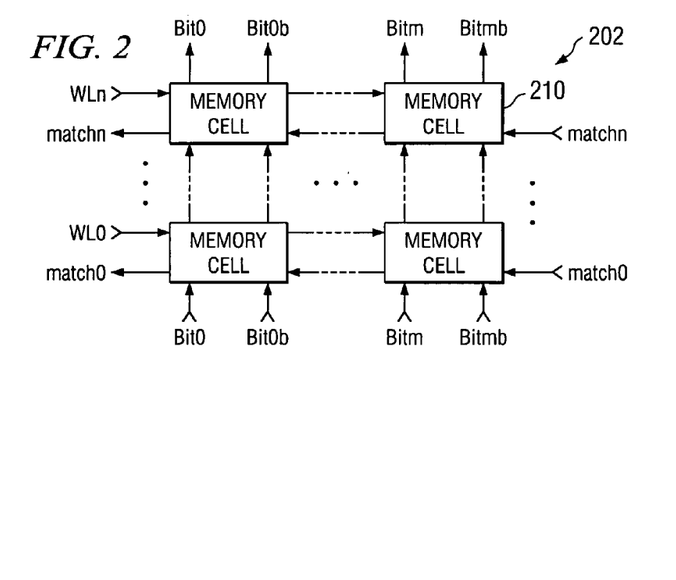
FIG. 2 is a detailed diagram illustrating a memory array, according to the present invention.

FIG. 2 illustrates the memory array 202 in more detail. The memory array 202 contains several memory cells 210. Each memory cell 210 contains several transistors and performs traditional read and write functions. The memory cell 210 performs the same functions as a common single-port memory device.

Figure 3:
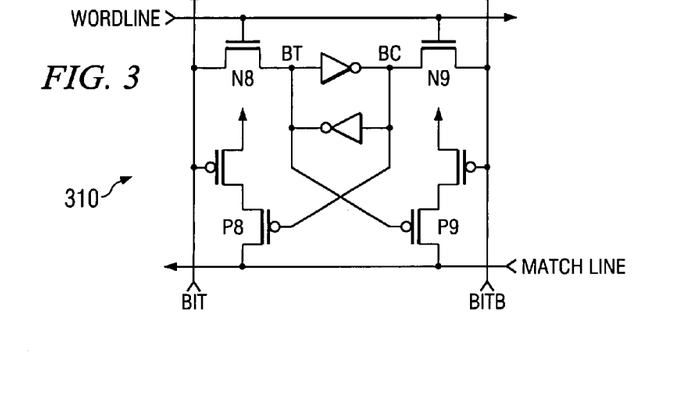
FIG. 3 is a schematic diagram showing a memory cell, according to one embodiment of the present invention.

Additionally, the memory cell 210 also performs as a CAM when connected to the other CAM memory cells of the memory array 202, as shown in FIG. 2. FIG. 3 shows the memory cell 310 in detail. The BIT and BITB inputs to the memory cell 310 are normally HIGH when not "reading" or "writing". If the memory cell 310 has a "one" stored in it, the "BT" node will be at a logic HIGH and the "BC" node will be at a logic LOW. If the memory cell 310 has a "zero" stored in it, the "BT" node will be at a logic LOW and the "BC" node will be at a logic HIGH.

When a CAM search operation is done for a logic "one", the BITB bitline will pull to a LOW state. If the search is done for a logic "zero", the BIT bitline will pull LOW. The CAM cell 310 does a "compare" such that—if BIT and BC are at a logic LOW, or if BITB and BT are at a logic LOW state, the match line will pull to a logic HIGH, indicating a mismatch between the bitlines and the value stored in the memory cell 310. The memory array 102, 202 is constructed such that a word has all of the match lines for that word common, so that a mismatch on any bit of the word will cause the match line to switch to a logic HIGH state. If all of the bits for the word match their respective bitlines, the match line will remain LOW, indicating that the word in the memory-cell-210, 310 matches the word on the data input.

Figure 4A:
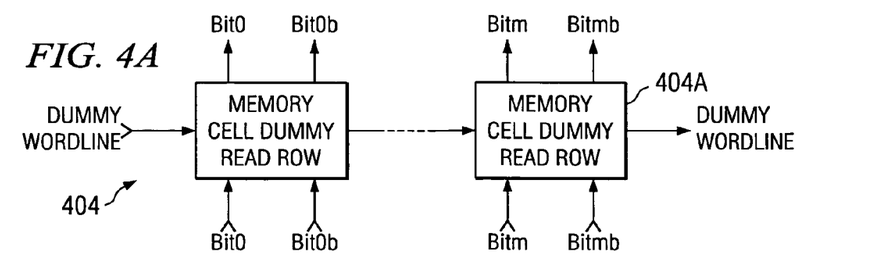
FIGS. 4A-4B are diagrams showing a dummy read row, with FIG. 4A being a block diagram of a dummy read row and FIG. 4B being a schematic diagram of a memory cell dummy read row, according to the present invention.
Figure 4B:
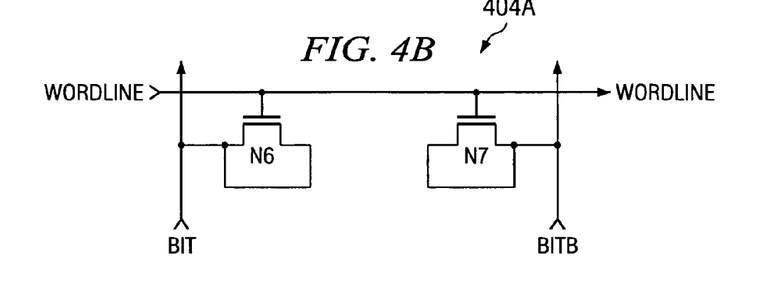

FIG. 4A shows a dummy read row 404 containing memory cell dummy read row cells 404A. FIG. 4B schematically shows the memory cell dummy read row cell 404A. The memory cell dummy read row cell 404A is a timing matching circuit that is designed to match the timing characteristics of the wordline (wl) signal in the memory cell 310. The memory cell dummy read row cell 404A is constructed such that two n-channel gates N6, N7 are connected to the wordline WL to match the layout parasitics of the n-channel gates N8, N9 on the wordline WL for the memory cell 310 in the memory array 102, 202.

Figure 5:
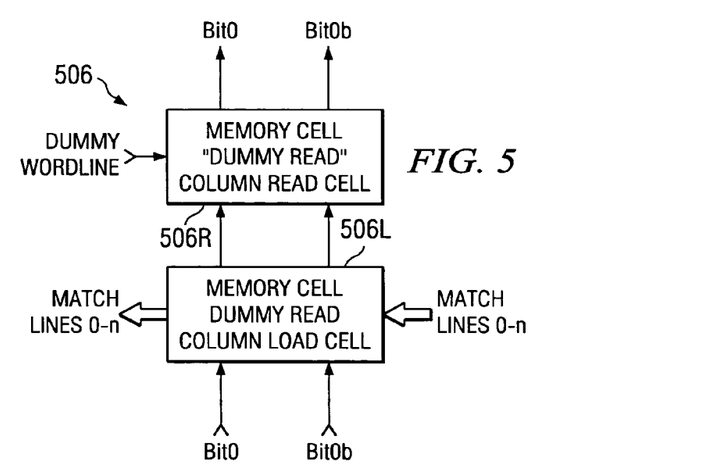
FIG. 5 is a block diagram illustrating a dummy read column, according to the present invention.
Figure 6A:
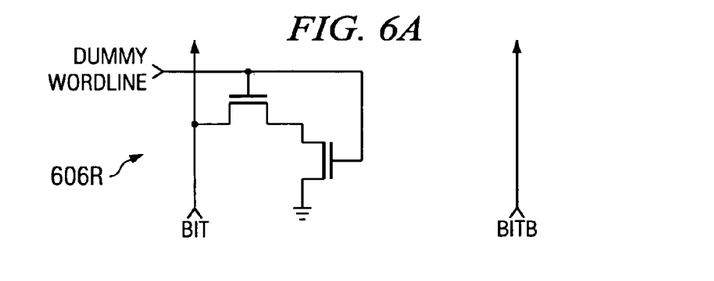
FIGS. 6A-6B are schematic diagrams, with FIG. 6A being a dummy read column read cell, and FIG. 6B being a dummy read column load cell, according to the present invention.
Figure 6B:
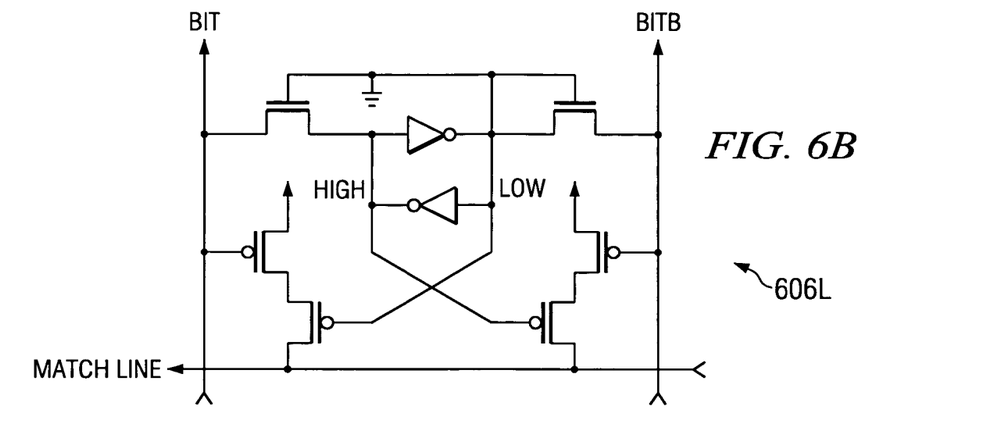

FIG. 5 illustrates a dummy read column 506 having two cells (memory cell dummy read column read cell 506R, memory cell dummy read column load cell 506L), which along with the dummy read row 404 are designed to match the timing of the memory "read", so that the read time of the memory cell 210 can be approximated. The read cell 506R circuit is designed to behave as a "memory read" to set the read timing, and the load cell 506L is designed to produce a behavior similar to the memory cell bitline parasitics, as shown in FIGS. 6A-6B. Accordingly, FIG. 6A schematically shows the dummy read column read cell 606R, while FIG. 6B shows the dummy read column load cell 606L.

Figure 7A:
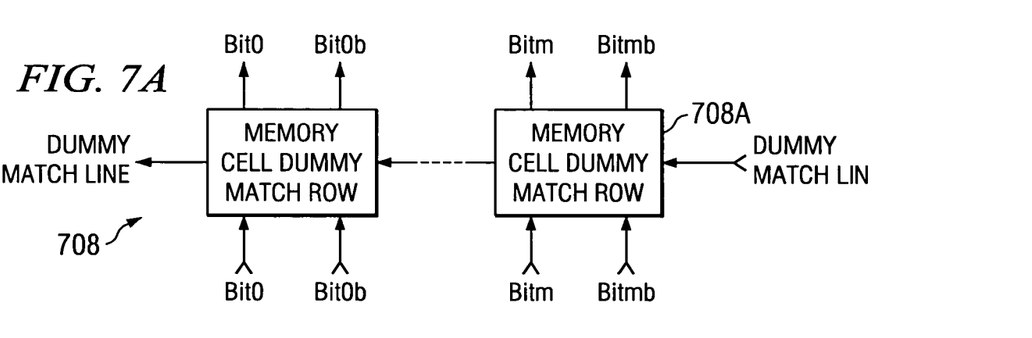
Figure 7B:
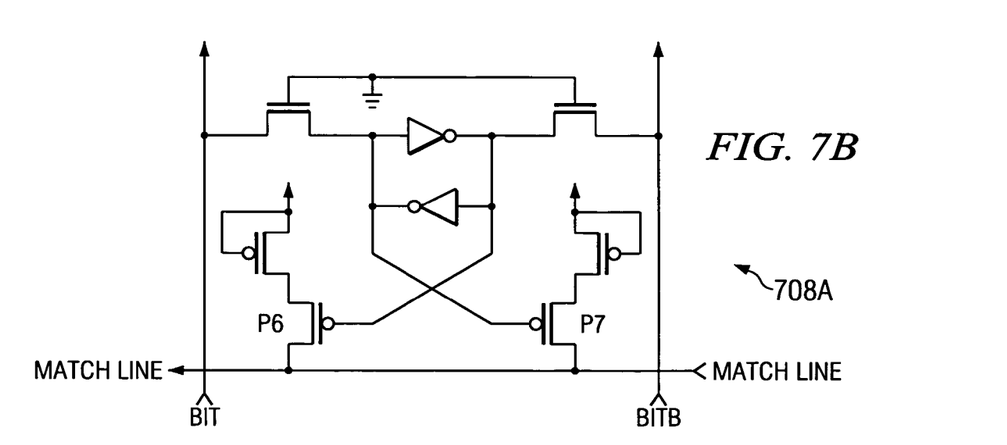
FIG. 7B is a schematic diagram showing a memory cell dummy match row, according to the present invention.

FIG. 7A illustrates a dummy match row 708 containing memory cell dummy match row cells 708A. FIG. 7B shows the memory cell dummy match row cell 708A in detail. The dummy match row 708 is designed to match the layout parasitics of the "Match lines" of the memory cell 210, 310 of the memory array 102, 202. The "match line" has two p-channels P6, P7 connected to it, similar to P8, P9 of the memory cell 310 of the memory array 102, 202. The memory cell dummy match row 708A cell is constructed such that the p-channel will not pull the "match line" to a logic HIGH state.

Figure 8A:
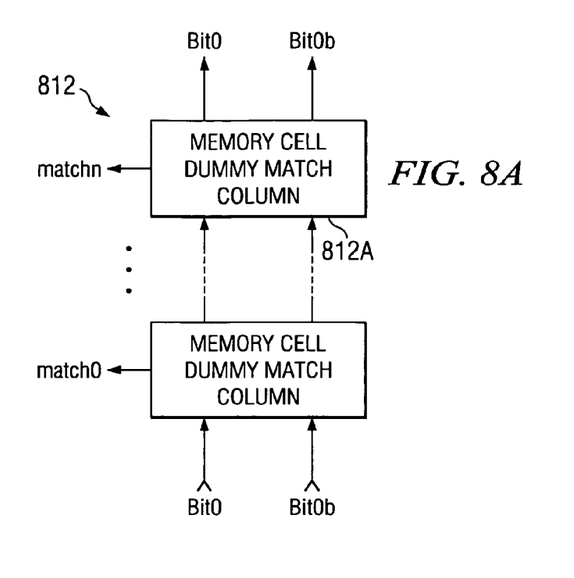
Figure 8B:
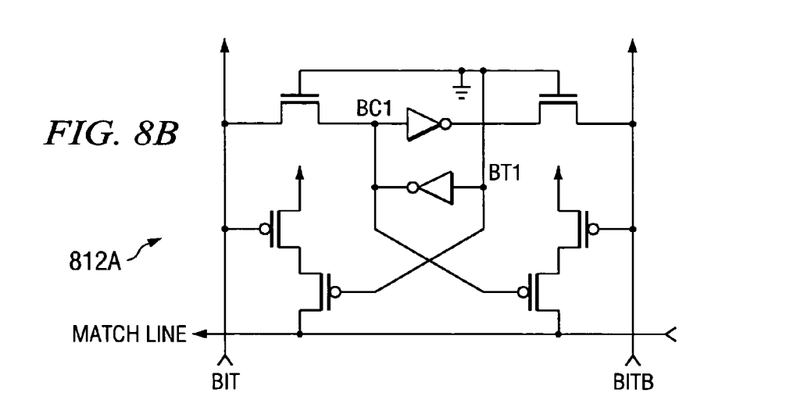
FIG. 8B is a schematic diagram showing a memory cell dummy match column, according to the present invention.

FIG. 8A shows a dummy match column 812 containing memory cell dummy match column cells 812A, according to one embodiment of the present invention. FIG. 8B shows the memory cell dummy match column cell 812A in detail. The dummy match column 812 is designed to match the bitline loading of the memory cell 210 of the memory array 102 during a search. It is constructed such that the node BC1 is at a logic HIGH and the node BT1 will always be at a logic LOW. If BIT is pulled LOW during a search, the match line will, pull to a logic HIGH indicating a "miss". If BITB is at a logic LOW, the match line will stay LOW, indicating a "hit".

During a normal search, the dummy match column 812 does not pull the match line to a logic HIGH state. One of the test modes, which will be discussed later, includes a mode where every cell of the dummy match column 812 generates logic HIGH levels on the match lines.

Figure 9:
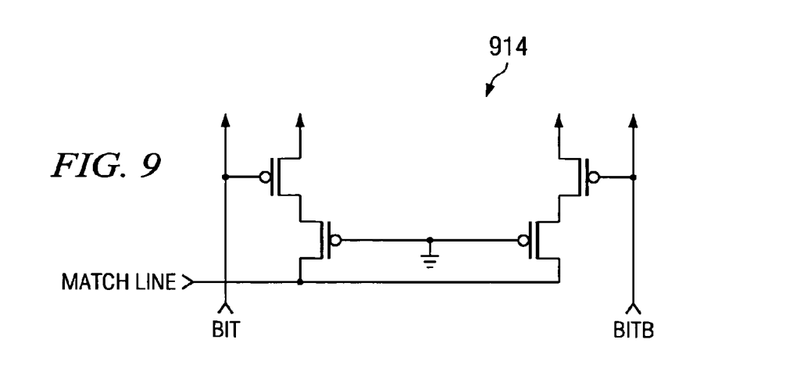
FIG. 9 is a schematic diagram illustrating a dummy timing circuit, according to the present invention.

FIG. 9 illustrates a dummy timing circuit 914 according to an embodiment of the present invention. The dummy timing circuit 914 is designed to generate a "miss" on its match line anytime a search is performed. This is done so that the match line signal matches the timing of the match signals of the memory cell 210, 310 of the memory array 102, 202. In the memory array 102, 202, the match line will pull HIGH, if there is at least one bit in the memory word that is different than the data input word. The match line of the memory array 102, 202 will transition faster if more than one bit is different than the data input, and it is slowest if there is only one bit different than the data word.

The dummy timing circuit 914 is designed so as to match the case where there is only one bit different present. The dummy timing match signal on the "dummy match line" triggers the priority encoder PE to latch the results of the CAM search. If the timing signal is faster than the memory, the priority encoder PE will fail.

Figure 10:
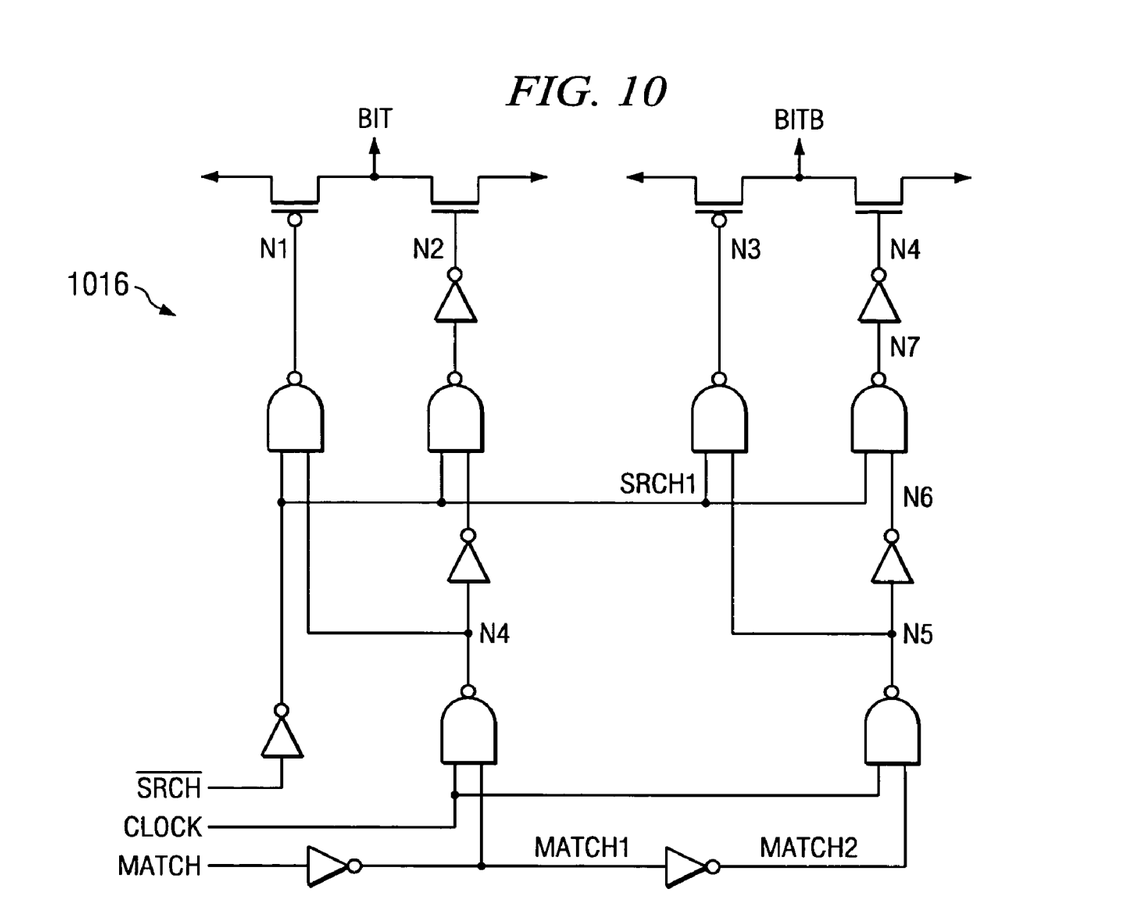
FIG. 10 is a schematic diagram showing a dummy match control circuit, according to the present invention.

FIG. 10 schematically shows a dummy match control circuit 1016. The corresponding logic states are listed in Table 1, shown below. The dummy match control circuit 1016 serves at least two purposes. In the normal search mode, with the "MATCH" input at a logic HIGH and "SRCH" input at a logic LOW, the dummy match control circuit 1016 generates a LOW transition on the "BITB" signal. The "BIT" signal remains HIGH. This transition is designed so as to match the timing of the bitline transitions of the memory cells 210 of the memory array 102. In this mode, the dummy timing circuit 114, 914 causes the "dummy match line" to transit to a HIGH state, but the other cells of the dummy match column 112 do not trigger their "match lines" to switch to a HIGH state.

In the test modes where the "MATCH" input signal is a logic HIGH and "SRCH" is a logic LOW, the dummy match control circuit 1016 generates a LOW transition on the "BIT" signal. The "BITB" signal remains HIGH. In this (test) mode, the dummy timing-circuit 114, 914 causes the "dummy match line" to transit to a HIGH state. Further, the other cells in the dummy match column 112, 812 also cause their match lines to transit to a logic HIGH state.

TABLE 1

| SRCH | MATCH | BIT | BITB | MODE |
|---|---|---|---|---|
| 0 | 0 | L | H | Test |
| 0 | 1 | H | L | Normal |
| 1 | 0 | Z | Z | |
| 1 | 1 | Z | Z | |

Modes of Operation:

Normal Mode: In the normal search mode, the "SRCH" input is a logic LOW, and the "MATCH" input is a logic HIGH in the dummy match control circuit 1016. The "MATCH" input is supplied externally, and the "CLOCK" and "SRCH" signals are generated by the CAM's control block CB. The "CLOCK" signal is HIGH during a search function. During a normal search, the "SRCH1" node will be a logic HIGH, "MATCH1" will be a logic LOW, and "MATCH2" will be a logic HIGH. When the "CLOCK" input transitions to a logic HIGH, the "N5" signal will transition to a logic LOW, thereby causing the signal "N3" to transition to a logic LOW and "N4" to transition to a logic HIGH state. This causes BITB to transition to a logic LOW. The signal "N4" is at a logic HIGH.

Therefore, the signal "N1" is a logic HIGH and "N2" is a logic LOW, which causes "BIT" to remain at a logic HIGH state. The "BIT" and "BITB" signals are connected to the dummy match column 112. In this mode, when "BITB" transitions to a logic LOW, with "BIT" at a logic HIGH, the dummy timing circuit 114, 914 generates a HIGH transition on its "dummy match line". This signal is passed to the dummy match row 108, 708, which further passes it to the priority encoder control unit PEC to trigger the priority encoder PE. The remaining cells in the dummy match column 112 do not cause their match lines to transition to a HIGH.

When a normal search is performed, in MODE 1, the value on DATA IN is presented to the memory array 102 via the memory cell bitlines BIT and BITB, and is compared with the value in the memory cells 210, 310. If a word matches the value on the bitline, the match line for that word will remain LOW, indicating a match. Otherwise, the match line will transition to a HIGH, indicating a "miss". This transition is designed to have the same speed as the signal generated by the dummy timing circuit 114 that triggers the priority encoder PE.

In the memory array 102, the match signal for each word during a SEARCH is dependent on the number of bits that the particular word differs from that of DATA IN. A word that differs from the search word on DATA IN by one bit will be slower than a word that differs by two bits, and the two-bit difference word will be slower than a three-bit difference word, and so on.

When a normal search is performed, in MODE 2, the "SRCH" input is LOW and "MATCH" is HIGH. In addition, the mask inputs are set to HIGH such that the memory array 102 is not searched. In this mode, the mask inputs disable the bitlines in the memory array 102, 202, thereby causing them to remain HIGH during the search. This causes the memory array 102, 202 to generate all hits. Thus, the memory match lines are not pulled to a HIGH state by the memory.

The dummy match control circuit 116, 1016 will generate a HIGH on the BIT signal and a LOW on the BITB signal. These signals connect with the dummy timing circuit 114, 914, which causes a HIGH transition on the "dummy match line" so as to trigger the priority encoder PE. Additionally, the BIT and BITB signals connect to the dummy match column 112 and do not generate HIGH transitions in any of the memory cell dummy match column cells 812A. Because these match signals are common to the match lines of the memory array 102, the match lines going from the memory array 102 to the priority encoder PE will remain LOW.

Consequently, the priority encoder PE will get a match on every memory word. This test is a test designed for a complete match on the memory array 102 without using the memory array 102. The memory does not need initialization, thereby reducing the required test time.

Search Test/Memory Bypass Mode: In the Search Test/ Memory Bypass mode, MODE 3, the "SRCH" input is LOW and "MATCH" is LOW. In addition, the mask inputs are set to HIGH so that the memory array 102 is not searched. In this mode, the mask inputs disable the bitlines in the memory array 102, which causes them to remain HIGH during the search. This causes the memory array 102 to generate all hits, and the memory "match lines" will not be pulled to a HIGH state by the memory.

The dummy match control circuit 116 will generate a LOW on the BIT signal and a HIGH on the BITB signal. These signals connect to the dummy timing circuit 114, which causes a HIGH transition on its "dummy match line" to trigger the priority encoder PE. Additionally, the BIT and BITB signals connect to the dummy match column 112, and generate HIGH transitions in all of the memory cell dummy match column circuits 812A. Since the match signals are common to the match lines of the memory array 102, the match lines going from the memory array 102 to the priority encoder PE will transition to a logic HIGH.

Therefore, the result is that the priority encoder PE will get a miss on every memory word, and since only the memory cell dummy match column circuits 812A caused the transition, the speed of the transition will be the worst-case speed path, which is a single-bit miss. This test is a test for a complete miss on the memory array 102—without using the memory array 102. The memory does not need initialization, thereby reducing the test time required.

Accordingly, the present invention can test the CAM functions very efficiently, thereby reducing the test time. For example, in one embodiment, a test sequence includes testing the CAM functions in mode 1, and if the CAM functions pass, the test is complete—since the memory 102 and priority encoder PE passed.

If not, the testing continues in mode 2 and mode 3. If the CAM functions pass modes 2 and 3, after failing mode 1, it indicates that the contents of the memory 102 are incorrect, but the priority encoder PE is good. If the CAM functions fail the test in all modes—namely, mode 1, mode 2 and mode 3, then it indicates that both the memory 102 and the priority encoder PE have failed.

Advantageously, by utilizing various modes, the CAM can be debugged to isolate memory failures from priority encoder failures, which significantly reduces the need for design changes.

The present invention, in other embodiments, is implemented, for example, by coupling the above-described circuits with non-illustrated circuit substrates.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

In view of the above, it can be seen the present invention presents a significant advancement in the art of memories such as CAMs. Further, the present invention has been described inconsiderable detail in order to provide those skilled in the art with the information needed to apply the novel principles and to construct and use such specialized components, as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types according to the inventive principles set forth herein above.

Moreover, although the present invention has been described in detail with reference to certain versions thereof, other versions are possible. Some components are shown directly connected to one another while others are shown coupled through intermediate components. In each instance, the method of interconnection establishes some electrical communication between two or more circuit nodes. Such communication and the logic functions of the circuits may often be accomplished using a number of circuit configurations, as will be understood by those of ordinary skill in the art. Therefore, the spirit and scope of the appended claims should not be limited to the description of the versions illustrated in the figures.

What is claimed is:

1. An electronic memory test structure for testing a CAM having a memory array containing memory cells, the electronic test structure comprising:
   a dummy match row unit coupled to the memory array and configured to match layout parasitics of match lines of the memory cells;
   a dummy match column having dummy match cells coupled to the memory array through the match lines, said dummy match column being configured so as to match bitline loading of the memory cells during a search;
   a dummy timing circuit coupled to the dummy match column and to the dummy match row, said dummy timing circuit being configured to always generate a miss on a dummy match line during the search; and
   a dummy match control circuit coupled to the dummy timing circuit.

2. The electronic memory test structure according to claim 1, wherein the dummy match column is configured so as not to pull the match lines to a logic high state during a normal search mode.

3. The electronic memory test structure according to claim 1, wherein the dummy match control circuit causes a transition so as to match the timing of bitline transitions of the memory cells.

4. The electronic memory test structure according to claim 1, wherein the dummy timing circuit always generates a miss on the dummy match line by causing the dummy match line to transit to a high state.

5. The electronic memory test structure according to claim 1, wherein:
   the dummy match control circuit has a low search input and one of a low match state and a high match state; and
   mask inputs are set to high so that the memory array is not searched.

6. The electronic memory test structure according to claim 5, further comprising:
   a priority encoder coupled to the memory array through the match lines.

7. The electronic memory test structure according to claim 6, further comprising:
   a priority encoder control unit coupled to the priority encoder, and to the dummy match row unit through the dummy match line.

8. The electronic memory test structure according to claim 6, wherein each cell of the dummy match column generates a logic high level on the match lines during a test mode for passing onto the memory array.

9. The electronic memory test structure according to claim 8, wherein the priority encoder receives all the generated logic high levels through the match lines.

10. The electronic memory test structure according to claim 8, wherein the test mode is all-hits mode.

11. The electronic memory test structure according to claim 6, wherein any cell of the dummy match column does not generate a logic high level on the match lines during another test mode.

12. The electronic memory test structure according to claim 11, wherein the match lines from the memory array to the priority encoder are at low levels.

13. The electronic memory test structure according to claim 11, wherein the other test mode is all-misses mode.

14. The electronic memory test structure according to claim 6, further comprising:
   a dummy read row unit and a dummy read column unit coupled to the memory array for matching timing characteristics of the wordline signals of the memory array; and
   an interconnected match latch unit and wordline driver coupled between the priority encoder and memory array.

15. An integrated circuit for testing a CAM having a memory array containing memory cells, comprising:
   an integrated circuit substrate having a dummy match row unit coupled to the memory array, said dummy match row unit configured to match layout parasitics of match lines of the memory cells;
   a dummy match column having dummy match cells coupled to the memory array through the match lines, said dummy match column being configured so as to match bitline loading of the memory cells during a search;
   a dummy timing circuit coupled to the dummy match column and to the dummy match row, said dummy timing circuit being configured to always generate a miss on a dummy match line during the search; and
   a dummy match control circuit coupled to the dummy timing circuit.

* * * * *